United States Patent
Chang et al.

(10) Patent No.: US 8,878,423 B2
(45) Date of Patent: Nov. 4, 2014

(54) LIGHT EMITTING DEVICE

(75) Inventors: Pei-Ying Chang, Taoyuan County (TW); Shi-Ing Huang, Miaoli County (TW); Tien-Fu Huang, Hsinchu County (TW); Chen-Dao Shiao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 136 days.

(21) Appl. No.: 12/982,604

(22) Filed: Dec. 30, 2010

(65) Prior Publication Data

US 2012/0153798 A1   Jun. 21, 2012

(30) Foreign Application Priority Data

Dec. 16, 2010 (TW) ............................... 99144149 A

(51) Int. Cl.
H01J 5/16 (2006.01)
H01J 61/40 (2006.01)
H01K 1/26 (2006.01)
H01K 1/30 (2006.01)
G02B 5/02 (2006.01)

(52) U.S. Cl.
CPC ............ G02B 5/0242 (2013.01); G02B 5/0278 (2013.01); H01L 2933/0091 (2013.01)
USPC ........... 313/116; 313/498; 362/558; 362/246; 362/355

(58) Field of Classification Search
USPC ................... 313/498, 116; 362/558, 246, 355
See application file for complete search history.

(56) References Cited

U.S. PATENT DOCUMENTS

| | | | | |
|---|---|---|---|---|
| 3,573,141 A * | 3/1971 | Chen et al. | ..................... | 359/453 |
| 3,682,530 A * | 8/1972 | De Palma et al. | ............ | 359/453 |
| RE28,516 E * | 8/1975 | Lu et al. | ......................... | 428/213 |
| 4,174,883 A | 11/1979 | Imataki et al. | | |
| 4,764,707 A | 8/1988 | Cheng Wei | | |
| 6,424,786 B1 * | 7/2002 | Beeson et al. | ................ | 385/146 |
| 6,602,596 B2 * | 8/2003 | Kimura et al. | ................ | 428/327 |
| 6,738,112 B1 * | 5/2004 | Sekiguchi | ....................... | 349/63 |
| 6,878,436 B2 * | 4/2005 | Reilly et al. | ................. | 428/221 |
| 7,190,525 B2 * | 3/2007 | Ito et al. | ......................... | 359/599 |
| 7,583,335 B2 * | 9/2009 | Sekiguchi | ..................... | 349/112 |
| 7,586,562 B2 * | 9/2009 | Ito | .................................. | 349/98 |
| 8,014,066 B2 * | 9/2011 | Teather et al. | ................ | 359/449 |
| 8,187,699 B2 * | 5/2012 | Iwata et al. | ................... | 428/220 |
| 8,241,737 B2 * | 8/2012 | Iwata et al. | ................... | 428/220 |
| 8,310,771 B2 * | 11/2012 | Shim | ............................. | 359/800 |
| 2002/0005924 A1 * | 1/2002 | Kimura | ......................... | 349/112 |
| 2002/0027626 A1 * | 3/2002 | Hiraishi et al. | ............... | 349/112 |
| 2003/0002153 A1 * | 1/2003 | Hiraishi et al. | ............... | 359/452 |
| 2003/0081313 A1 * | 5/2003 | Hiraishi et al. | ............... | 359/483 |
| 2003/0156238 A1 * | 8/2003 | Hiraishi et al. | ............... | 349/112 |
| 2003/0218192 A1 * | 11/2003 | Reilly et al. | ................... | 257/200 |
| 2005/0063062 A1 * | 3/2005 | Ito et al. | ......................... | 359/599 |
| 2006/0072054 A1 * | 4/2006 | Ito | .................................. | 349/96 |
| 2006/0204744 A1 * | 9/2006 | Hiraishi et al. | ............... | 428/327 |
| 2008/0030994 A1 | 2/2008 | Chang | | |
| 2008/0043455 A1 | 2/2008 | Chang | | |
| 2008/0310171 A1 * | 12/2008 | Hiraishi et al. | ............... | 362/339 |
| 2009/0225416 A1 * | 9/2009 | Teather et al. | ................ | 359/449 |
| 2009/0257220 A1 | 10/2009 | Lenk et al. | | |
| 2010/0091374 A1 * | 4/2010 | Iwata et al. | ..................... | 359/599 |
| 2010/0195313 A1 * | 8/2010 | Hiraishi et al. | ............... | 362/97.1 |
| 2011/0006668 A1 * | 1/2011 | Hussell et al. | ................ | 313/499 |
| 2011/0045259 A1 * | 2/2011 | Bockmeyer et al. | .......... | 428/212 |
| 2011/0317283 A1 * | 12/2011 | Shim | ............................. | 359/722 |
| 2012/0002397 A1 * | 1/2012 | Iwata et al. | ................... | 362/97.1 |

FOREIGN PATENT DOCUMENTS

| | | |
|---|---|---|
| CN | 201672441 U | 12/2010 |
| JP | 52-55651 | 5/1977 |
| JP | 2000-200502 | 7/2000 |
| JP | 2004-341446 | 12/2004 |
| WO | WO 01/79895 | 10/2001 |
| WO | WO 2007/142438 | 12/2007 |

OTHER PUBLICATIONS

European Patent Office, European Search Report, Application No. 11153283.4, Jun. 8, 2011, Europe.
G. Machado et al., "Crystalline Properties and Morphological Changes in Plastically Deformed Isotatic Polypropylene Evaluated by X-ray Diffraction and Transmission Electron Microscopy," European Polymer Journal, Aug. 11, 2004, pp. 129-138, vol. 41, Elsevier, US.
Jean-Hong, Chen et al., "Morphology and Thermal Properties in the Binary Blends of Poly(Propylene-co-ethylene) Copolymer and Isotactic Polypropylene with Polyethylene," Polymer, Mar. 2007, vol. 48, pp. 2946-2957, Elsevier, US.
Japan Patent Office, Office Action, Patent Application Serial No. 2011-092301, Jan. 8, 2013, Japan.
China Patent Office, Office Action, Patent Application Serial No. 201010609584.4, Dec. 2, 2013, China.

* cited by examiner

Primary Examiner — Thomas A Hollweg

(57) ABSTRACT

Disclosed is a light-emitting device, including an LED light source and a light diffusion element. The light diffusion element, covering at least a part of the LED light source, is composed of a first polymer, a second polymer, or a blend of them. The first polymer has a larger crystal diameter than that of the second polymer. The first polymer is made of polypropylene or ethylene-propylene copolymer. The second polymer is made of polyethylene, polypropylene, or ethylene-propylene copolymer. A blend of certain ratios of the first and second polymer gives rise of an excellent material that has improved light diffusion. This material can be widely adopted to current light fixtures for its evenly distributed lighting and great brightness.

20 Claims, No Drawings

LIGHT EMITTING DEVICE

CROSS REFERENCE TO RELATED APPLICATIONS

This Application claims priority proprietary of Taiwan Patent Application No. 099144149, filed on Dec. 16, 2010, the entirety of which is incorporated by reference herein.

BACKGROUND OF THE INVENTION

1. Field of the Invention

This invention relates to light emitting devices, and in particular relates to light diffusion elements thereof.

2. Description of the Related Art

Present lighting fixtures have higher brightness than previous ones due to the development of technology and improvement of lighting devices thereof. For example, light emitting diodes (LED) which have long lifetimes, low power consumption, and high brightness are widely applied in light fixtures everywhere.

Although lighting fixtures with high brightness may efficiently enhance brightness of the surrounding, their focused brightness is harsh to users. In the worst case, the eyes of a user could be damaged by the focused brightness. In addition, lighting devices emit radiative light rather than evenly distributed light.

To solve the focused brightness problem of LEDs, light diffusion element can be set outside of the light source. The light diffusion element can be mainly manufactured by two methods. The first method is to add inorganic particles (such as silicon oxide, titanium oxide, or the likes) to polymers with high transparency (such as polycarbonate, poly methyl-methacrylate, polystyrene, or the likes). The optical properties of the composite materials are determined by factors such as the size and amount of inorganic particles. Unfortunately, it is difficult to evenly disperse the inorganic particles in the organic polymer, and therefore the surface of the inorganic particles must be modified. The second method is to create wave- or lens-shaped micro structures on the surface of a polymer that has high transparency. These two methods, however, increase the complication and cost of mass production processes.

Accordingly, a novel material composition to solve the problems of the conventional light diffusion element is called for.

BRIEF SUMMARY OF THE INVENTION

One embodiment of the disclosure provides light-emitting device, comprising: an LED light source; and light diffusion element covering at least a part of the LED light source, wherein the light diffusion source comprises a first polymer, a second polymer, or a blend of the first polymer and the second polymer. The first polymer has a larger crystal diameter than that of the second polymer, the first polymer comprises polypropylene or ethylene-propylene copolymer, and the second polymer comprises polyethylene, polypropylene, or ethylene-propylene copolymer.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The disclosure provides light emitting device, including a LED light source and a light diffusion element. The LED light source can be a point light source composed of a single LED, or a face light source composed of a plurality of LEDs arranged in an array. The light diffusion element covers at least a part of the LED light source, wherein the light diffusion element can be shaped into a board, tube, droplet, ball shape, or other suitable shapes. Whatever shape is adopted to form the light diffusion element, the light that comes from the LED light source and emits to the eyes of a user should travel through the light diffusion element. In one embodiment, the light diffusion element serving as a part of a packaging structure may directly contact the LED source. In another embodiment, the light diffusion element does not directly contact the LED light source; the light diffusion element and the LED light source can be separated by a space or other elements.

The light diffusion element includes a first polymer, a second polymer, or a blend of the first polymer and the second polymer, wherein the first polymer has a larger crystal diameter than that of the second polymer. In addition, the properties of the light diffusion element depend on crystal conditions thereof, e.g. crystal degree and ratio of the first and second polymers. When the crystal degree of the first polymer is close to that of the second polymer, the crystal diameter difference of the first and second polymers will make the blend of the first and second polymers have excellent light diffusion properties. In one embodiment, the first polymer includes polypropylene or ethylene-propylene copolymer, and the second polymer includes polyethylene, polypropylene, or ethylene-propylene copolymer. Note that if the first polymer and/or the second polymer is ethylene-propylene copolymer, the ethylene monomer and the propylene monomer should have a weight ratio of less than or equal to 20:100. An overly high amount of the ethylene monomer may degrade properties, such as influence light transmission and reduce thermal resistance and mechanical strength, of products made therefrom.

In one embodiment, the first polymer has a crystal degree of 40% to 70% at room temperature, a crystal diameter of 1 µm to 120 µm, a weight-average molecular weight of 10,000 to 1,000,000, and a melting index of 0.1 g/10 min to 200 g/10 min (measured by an ASTM D1238 or ISO1133). An overly low crystal degree of the first polymer may influence light diffusion rate of light traveling therethrough, which means an LED point light source would not be able to be diffused to a face light source with even distribution. An overly high crystal degree of the first polymer may influence transmission of light traveling therethrough and decrease the brightness of the light source. An overly large crystal diameter of the first polymer may influence light diffusion rate, which means an LED point light source cannot be diffused evenly. An overly small crystal diameter of the first polymer may influence transmission of light traveling therethrough, which means brightness of the light source would be hindered. In one embodiment, the first polymer may individually serve as the composition of the light diffusion element.

In one embodiment, the second polymer has a crystal degree of 40% to 70% at room temperature, a crystal diameter of 0.05 µm to 10 µm, a weight-average molecular weight of 10,000 to 1,000,000, and a melting index of 0.1 g/10 min to 200 g/10 min (measured by an ASTM D1238 or ISO1133). An overly low crystal degree of the second polymer may influence light diffusion rate of light traveling therethrough, which means an LED point light source would not be able to be diffused to a face light source with even distribution. An overly high crystal degree of the second polymer may influence transmission of light traveling therethrough, which means brightness of the light source would be hindered. An overly large crystal diameter of the second polymer may influence light diffusion rate of light traveling therethrough, which means an LED point light source would not be able to be diffused to a face light source with even distribution. An overly small crystal diameter of the second polymer may influence transmission of light traveling therethrough, which means brightness of the light source would be hindered. In one embodiment, the second polymer may individually serve as the composition of the light diffusion element.

Although the first polymer and the second polymer may individually serve as the composition of the light diffusion element, a blend thereof has an excellent light diffusion effect. These two polymers have very different crystal diameters, regardless of their similar degree of crystallization. This difference in crystal diameter of the first and second polymers gives the blend excellent light diffusion property. In general, the first polymer, with the larger crystal diameter, has a higher transmission than that of the second polymer with the smaller crystal diameter, but the second polymer with the smaller crystal diameter, has a higher light diffusion rate than the first polymer with the larger crystal diameter. On the basis of a common sense, the transmission of the blend of the first and second polymers should be between the transmission of the first and second polymers, and the light diffusion rate of the blend of the first and second polymers should be between the light diffusion rates of the first and second polymers. As proven in experiments of the disclosure, the transmission of the blend is between that of the first and the second polymers, but the light diffusion rate of the blend is higher than that of the first and second polymers. The phenomenon may be due to the smaller crystals of the second polymer filling into spaces between the larger crystals of the first polymer. In addition, the composition of the first polymer is similar to the composition of the second polymer, such that the first and second polymers can be evenly blended without reducing the light transmission.

In one embodiment, the first and second polymers are blended to serve as a composition of the light diffusion element. In the blend, the first polymer and the second polymer have a weight ratio of 50:50 to 95:5. An overly high weight ratio of the second polymer would reduce the transmission of the blend, and an overly low weight ratio of the second polymer cannot efficiently improve the light diffusion effect of the blend.

If the first polymer and the second polymer of different crystal degrees are blended, the blend with a crystal degree difference will have lower transmission. On the other hand, if the first polymer and the second polymer of similar crystal degrees are blended, the light diffusion effect of the blend can be achieved by the crystal diameter difference between the first and second polymers.

Because the first and second polymers are thermoplastic materials having similar physical properties, the light diffusion element can be molded by injection, extrusion, casting, or blown methods. The molding processes are free of an additional pelletization process, and therefore save on related costs. Because the crystals in the first and second polymer are of different diameters, and a blend of the first and second polymer may diffuse light, additional light diffusion agents or particles can be saved in the embodiments of this disclosure.

EXAMPLES

In Examples 1-7 and Comparative Examples 1-2, polypropylene (6331, commercially available from LCY Chemical Co.) was adopted as the first polymer, and ethylene-propylene copolymer (031, commercially available from LCY Chemical Co.) was adopted as the second polymer. The first polymer had a crystal degree of 48% and a crystal diameter of 1 μm to 120 μm. The second polymer had a crystal degree of 45% and a crystal diameter of 0.05 μm to 10 μm. In Example 8 and Comparative Examples 3-4, polypropylene (1120, commercially available from Formosa Plastics Co.) was adopted as the first polymer, and polypropylene (1124 commercially available from Formosa Plastics Co.) was adopted as the second polymer. The first polymer had a crystal degree of 50% and a crystal diameter of 5 μm to 120 μm. The second polymer had a crystal degree of 49% and a crystal diameter of 0.1 μm to 1 μm. The first and second polymers were blended with different weight ratios, and then injection molded to form a light diffusion board. The light diffusion board had a half-ball shape with a radius of 30 mm, and a thickness of 1.2 mm. The composition of the light diffusion boards in different Examples and Comparative Examples are tabulated in Tables 1 and 2.

The transmission and light diffusion rates of the light diffusion boards were measured by the JIS K 7136 standard, as shown in Tables 1 and 2.

TABLE 1

| | Weight ratio of the first polymer and the second polymer | Transmission (%) | Light diffusion rate (%) |
|---|---|---|---|
| Comparative Example 1 | 100:0 | 86.65 | 68.62 |
| Example 1 | 50:50 | 73.61 | 72.5 |
| Example 2 | 55:45 | 74.21 | 73.15 |
| Example 3 | 60:40 | 76.17 | 74.75 |
| Example 4 | 65:35 | 77.66 | 75.85 |
| Example 5 | 80:20 | 81.89 | 77.21 |
| Example 6 | 85:15 | 82.44 | 77.33 |
| Example 7 | 90:10 | 84.73 | 74.95 |
| Comparative Example 2 | 0:100 | 63.98 | 63.57 |

TABLE 2

| | Weight ratio of the first polymer and the second polymer | Transmission (%) | Light diffusion rate (%) |
|---|---|---|---|
| Comparative Example 3 | 100:0 | 86.34 | 70.78 |
| Example 8 | 80:20 | 86.12 | 72.37 |
| Comparative Example 4 | 0:100 | 84.51 | 45.12 |

As shown in the comparisons between Comparative Example 1, Comparative Example 2, and Examples 1-7 in Table 1, the transmission of the blends were between that of the first polymer and the second polymer, but the light diffusion rates of the blends were greater than that of the first polymer and the second polymer. Similarly, as shown in the comparisons between Comparative Example 3, Comparative Example 4, and Example 8 in Table 2, the transmission of the blends were between that of the first polymer and the second polymer, but the light diffusion rates of the blends were greater than that of the first and second polymers.

Furthermore, commercially available light diffusion boards were selected for comparison with the light diffusion boards (Example 6). The commercially available light diffusion boards were an A40 (commercially available from OSRAM, half-ball shaped with a radius of 30 mm, and a thickness of 1.2 mm) and KL005 (commercially available from Carry Beam Co. Ltd., half-ball shaped with a radius of 30 mm, and a thickness of 1.2 mm).

The transmission and light diffusion rates of the commercially available light diffusion boards and the light diffusion board in Example 6 were measured by the JIS K 7136 standard, as shown in Table 3.

TABLE 3

|  | Transmission (%) | Light diffusion rate (%) |
|---|---|---|
| Example 6 | 82.44 | 77.33 |
| OSRAM | 79.03 | 74.13 |
| Carry Beam | 56.06 | 55.74 |

As shown in Table 3, the polymer blended with an appropriate ratio had a higher transmission and light diffusion rate than that of the commercially available products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting device, comprising:
an LED light source; and
a light diffusion element covering at least a part of the LED light source,
wherein the light diffusion element comprises a single layer formed by blending a first polymer having a first crystal diameter and a second polymer having a second crystal diameter smaller than the first crystal diameter, and then molding the blend, such that the first polymer and the second polymer are evenly blended in the single layer, and the first polymer directly physically contacts the second polymer,
wherein the first polymer comprises polypropylene or ethylene-propylene copolymer, and
wherein the second polymer comprises polyethylene, polypropylene, or ethylene-propylene copolymer.

2. The light-emitting device as claimed in claim 1, wherein the first polymer has a crystal diameter of 1 μm to 120 μm.

3. The light-emitting device as claimed in claim 1, wherein the second polymer has a crystal diameter of 0.05 μm to 10 μm.

4. The light-emitting device as claimed in claim 1, wherein the first polymer and/or the second polymer has a crystal degree of 40% to 70% at room temperature.

5. The light-emitting device as claimed in claim 1, wherein the first polymer and/or the second polymer has a weight-average molecular weight of 10,000 to 1,000,000.

6. The light-emitting device as claimed in claim 1, wherein the blend has a transmission between that of the first polymer and that of the second polymer.

7. The light-emitting device as claimed in claim 1, wherein the blend has a higher light diffusion rate than that of the first polymer and the second polymer.

8. The light-emitting device as claimed in claim 1, wherein the first polymer and the second polymer of the blend have a weight ratio of 50:50 to 95:5.

9. The light-emitting device as claimed in claim 1, wherein the first polymer and/or the second polymer is ethylene-propylene copolymer, and wherein an ethylene monomer and a propylene monomer thereof have a weight ratio of less than or equal to 20:100.

10. The light-emitting device as claimed in claim 1, wherein the first polymer and/or the second polymer has a melting index of 0.1 g/10min to 200 g/10 min.

11. The light-emitting device as claimed in claim 1, wherein the light diffusion element is formed by blending the first and the second polymers and then injection molding the blend.

12. A light-emitting device, comprising:
an LED light source; and
a light diffusion element covering at least a part of the LED light source,
wherein the light diffusion element comprises a single layer formed by blending a first polymer having a first crystal diameter and a second polymer having a second crystal diameter smaller than the first crystal diameter, and then molding the blend without a carrier, such that the first polymer and the second polymer are evenly blended in the single layer,
wherein the first polymer comprises polypropylene or ethylene-propylene copolymer, and
wherein the second polymer comprises polyethylene, polypropylene, or ethylene-propylene copolymer.

13. The light-emitting device as claimed in claim 12, wherein the first polymer has a crystal diameter of 1 μm to 120 μm.

14. The light-emitting device as claimed in claim 12, wherein the second polymer has a crystal diameter of 0.05 μm to 10 μm.

15. The light-emitting device as claimed in claim 12, wherein the first polymer and/or the second polymer has a crystal degree of 40% to 70% at room temperature.

16. The light-emitting device as claimed in claim 12, wherein the first polymer and/or the second polymer has a weight-average molecular weight of 10,000 to 1,000,000.

17. The light-emitting device as claimed in claim 12, wherein the blend has a transmission between that of the first polymer and that of the second polymer.

18. The light-emitting device as claimed in claim 12, wherein the first polymer and the second polymer of the blend have a weight ratio of 50:50 to 95:5.

19. The light-emitting device as claimed in claim 12, wherein the first polymer and/or the second polymer is ethylene-propylene copolymer, and wherein an ethylene monomer and a propylene monomer thereof have a weight ratio of less than or equal to 20:100.

20. The light-emitting device as claimed in claim 12, wherein the first polymer and/or the second polymer has a melting index of 0.1 g/10 min to 200 g/10 min.

* * * * *